United States Patent
Tsutsui

(10) Patent No.: US 12,418,990 B2
(45) Date of Patent: Sep. 16, 2025

(54) SUBSTRATE TREATMENT METHOD AND SUBSTRATE TREATMENT SYSTEM

(71) Applicant: Tokyo Electron Limited, Tokyo (JP)

(72) Inventor: Tsutomu Tsutsui, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 291 days.

(21) Appl. No.: 17/783,133

(22) PCT Filed: Dec. 4, 2020

(86) PCT No.: PCT/JP2020/045255
§ 371 (c)(1),
(2) Date: Jun. 7, 2022

(87) PCT Pub. No.: WO2021/124929
PCT Pub. Date: Jun. 24, 2021

(65) Prior Publication Data
US 2023/0024937 A1     Jan. 26, 2023

(30) Foreign Application Priority Data
Dec. 17, 2019   (JP) ................................. 2019-227693

(51) Int. Cl.
*H01L 21/00* (2006.01)
*B05C 9/14* (2006.01)
(Continued)

(52) U.S. Cl.
CPC ............... *H05K 3/061* (2013.01); *B05C 9/14* (2013.01); *B05C 11/08* (2013.01); *B05D 1/002* (2013.01);
(Continued)

(58) Field of Classification Search
CPC ................... B05D 1/00; H01L 21/00
See application file for complete search history.

(56) References Cited

U.S. PATENT DOCUMENTS 5,939,130 A * 8/1999 Shiraishi ................. G03F 7/162
118/712
2002/0051644 A1 * 5/2002 Sugimoto ......... H01L 21/67028
396/564
(Continued)

FOREIGN PATENT DOCUMENTS

| JP | H08-107053 A | 4/1996 |
|---|---|---|
| TW | 201411715 A | 3/2014 |
| TW | 201740432 A | 11/2017 |

OTHER PUBLICATIONS

International Search Report mailed Feb. 9, 2021 issued in corresponding international patent application No. PCT/JP2020/045255 (and English translation).

*Primary Examiner* — Gordon Baldwin
*Assistant Examiner* — Mohammad Mayy
(74) *Attorney, Agent, or Firm* — Posz Law Group, PLC

(57) ABSTRACT

A substrate treatment method treats a substrate. The method includes the steps of: (A) heating the substrate having a coating film formed on a surface thereof by supply of a coating solution; (B), after the (A) step, moving a discharge destination of a removing solution from a peripheral position on the surface of the substrate toward a center side of the substrate and turning it back at a first position to return it again to the peripheral position while rotating the substrate; (C), after the (B) step, moving the discharge destination of the removing solution from the peripheral position on the surface of the substrate toward center side of the substrate and turning it back at a second position closer to an outside than the first position to return it again to the peripheral position while rotating the substrate; and (D), after the (C) step, heating again the substrate.

10 Claims, 9 Drawing Sheets

(51) Int. Cl.
*B05C 11/08* (2006.01)
*B05D 1/00* (2006.01)
*B05D 3/02* (2006.01)
*H05K 3/06* (2006.01)

(52) U.S. Cl.
CPC .... *B05D 3/0254* (2013.01); *H05K 2203/1105* (2013.01); *H05K 2203/15* (2013.01)

(56) References Cited

U.S. PATENT DOCUMENTS

| | | | |
|---|---|---|---|
| 2012/0029343 A1* | 2/2012 | Wasson | H01F 5/003 336/200 |
| 2015/0352587 A1* | 12/2015 | Ichino | B05C 5/0216 427/286 |
| 2018/0211832 A1* | 7/2018 | Hasimoto | B08B 3/041 |

* cited by examiner

SUBSTRATE TREATMENT METHOD AND SUBSTRATE TREATMENT SYSTEM

This application is a U.S. national stage application of International Application No. PCT/JP2020/045255 filed on Dec. 4, 2020, which is based upon and claims the benefit of priority of the prior Japanese Patent Application No. 2019-227693 filed on Dec. 17, 2019, the entire contents of which are incorporated herein by reference.

TECHNICAL FIELD

This disclosure relates to a substrate treatment method and a substrate treatment system.

BACKGROUND ART

Patent Document 1 discloses a method of removing a photoresist film formed at an outer periphery of a wafer having an orientation flat part. This method rotates the wafer around its center point as a rotation axis and applies a solvent to the outer periphery.

PRIOR ART DOCUMENT

Patent Document

Patent Document 1: Japanese Laid-open Patent Publication No. H8-107053

DISCLOSURE OF THE INVENTION

Problems to be Solved by the Invention

The technique according to this disclosure prevents, when removing a peripheral portion of a coating film formed on a substrate surface, a residue from being produced in a peripheral region on the substrate surface even when the viscosity of a coating solution used in forming the coating film is high and the thickness of the coating film is large.

Means for Solving the Problems

An aspect of this disclosure is a substrate treatment method for treating a substrate, including the steps of: (A) heating the substrate having a coating film formed on a surface thereof by supply of a coating solution; (B), after the (A) step, moving a discharge destination of a removing solution from a peripheral position on the surface of the substrate toward a center side of the substrate and turning it back at a first position to return it again to the peripheral position while rotating the substrate; (C), after the (B) step, moving the discharge destination of the removing solution from the peripheral position on the surface of the substrate toward center side of the substrate and turning it at a second position closer to an outside than the first position to return it again to the peripheral position while rotating the substrate; and (D), after the (C) step, heating again the substrate.

Effect of the Invention

According to this disclosure, it is possible to prevent, when removing a peripheral portion of a coating film formed on a substrate surface, a residue from being produced in a peripheral region on the substrate surface even when the viscosity of a coating solution used for the formation of the coating film is high and the thickness of the coating film is large.

EMBODIMENTS FOR CARRYING OUT THE INVENTION

Figure 1:
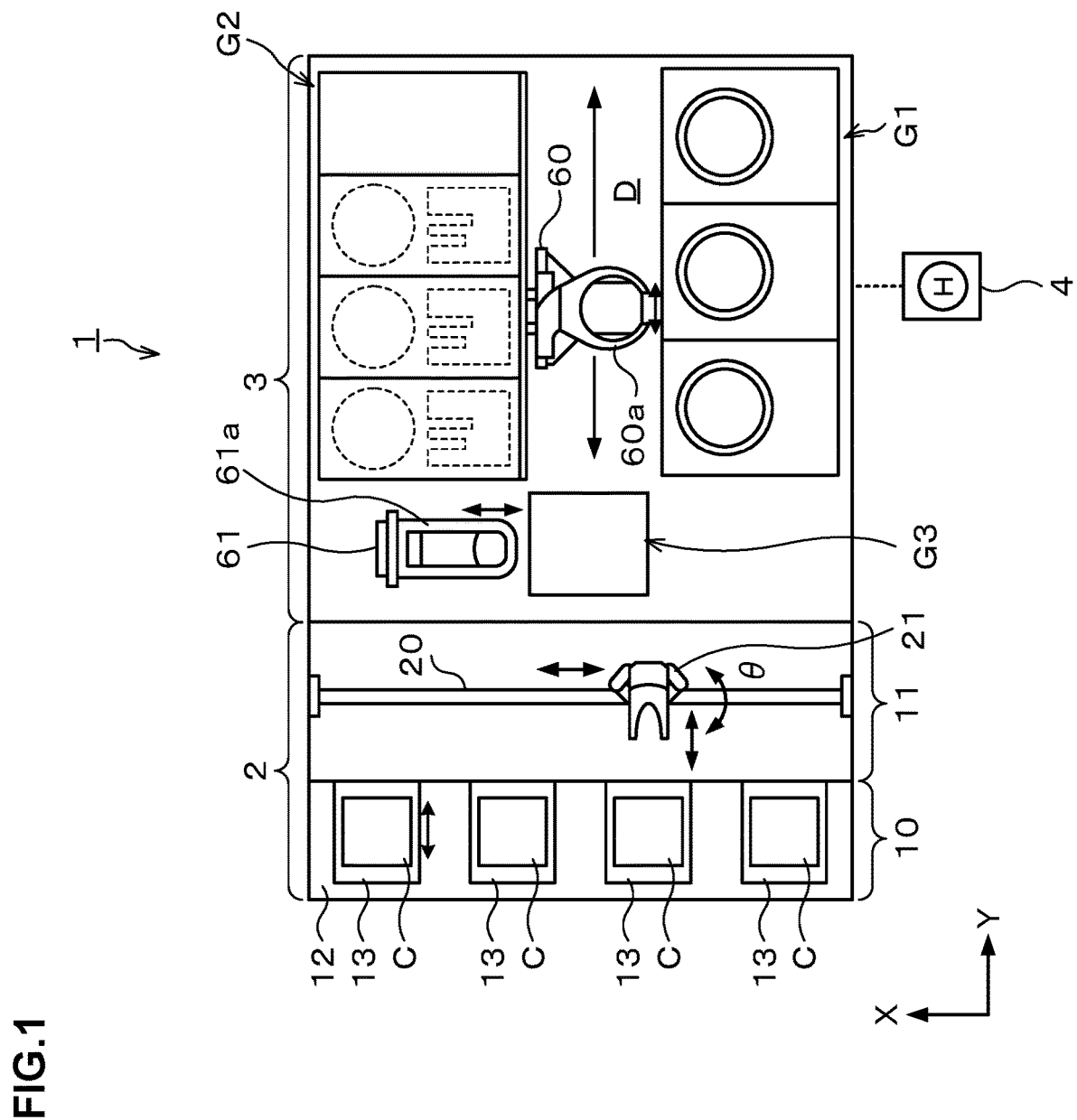
FIG. 1 is a plan view illustrating the outline of an internal configuration of a wafer treatment system as a substrate treatment system according to a first embodiment.

In a manufacturing process of a semiconductor device, generally, photolithography processing including a treatment of supplying a resist solution to a wafer surface and forming a resist film is performed on a semiconductor wafer (hereinafter, referred to as a "wafer" in some cases) to form a resist pattern in a desired shape on the wafer.

Further, when forming the resist pattern, a treatment (EBR (Edge Bead Removal) treatment) is performed which supplies a solvent to the wafer having the resist film formed on the surface to remove the resist film in a wafer peripheral region. The EBR treatment is performed for the purpose of preventing contamination of a portion in contact with the wafer of a transfer apparatus which transfers the wafer.

In Patent Document 1, when removing the photoresist film formed at the outer periphery of the wafer, the wafer is rotated around its center point as a rotation axis to apply the solvent at the outer periphery as explained above.

Incidentally, it is considered that a coating solution having high viscosity such as a polyimide solution is used in place of the resist solution having low viscosity which is normally used, to form a thick coating film on the wafer. For example, it is considered to discharge the polyimide solution onto the wafer surface to form a polyimide film, form a circuit pattern on the polyimide film by the photolithography processing, and then peel the polyimide film from the wafer and use it as a flexible circuit board.

Also in the case of forming the thick coating film on the wafer using the coating solution having high viscosity as explained above, the EBR treatment is performed. However, in this case, it is necessary to heat the wafer before the EBR treatment to eliminate the flowability of the coating solution on the wafer surface, namely, to solidify the coating film on the wafer surface. However, in the earnest investigation by the present inventors, if the heating treatment time of the wafer is made too long, a residue of the coating solution may be produced in the wafer peripheral region after the EBR treatment. Further, even if the heating treatment time of the wafer is appropriate, simply by rotating the wafer around its center point as a rotation axis and only supplying the solvent on its outer periphery as in Patent Document 1 as the EBR treatment, the residue of the coating solution may be similarly produced in the wafer peripheral region after the EBR treatment.

Hence, the technique according to this disclosure prevents when removing a peripheral portion of a coating film formed on a substrate surface, a residue from being produced in a peripheral region on the substrate surface even when the viscosity of a coating solution used in forming the coating film is high and the thickness of the coating film is large.

Hereinafter, a substrate treatment method and a substrate treatment system according to embodiments will be explained with reference to the drawings. Note that the same codes are given to components having substantially the same functional configurations in the description to omit duplicate explanation.

First Embodiment

Figure 2:
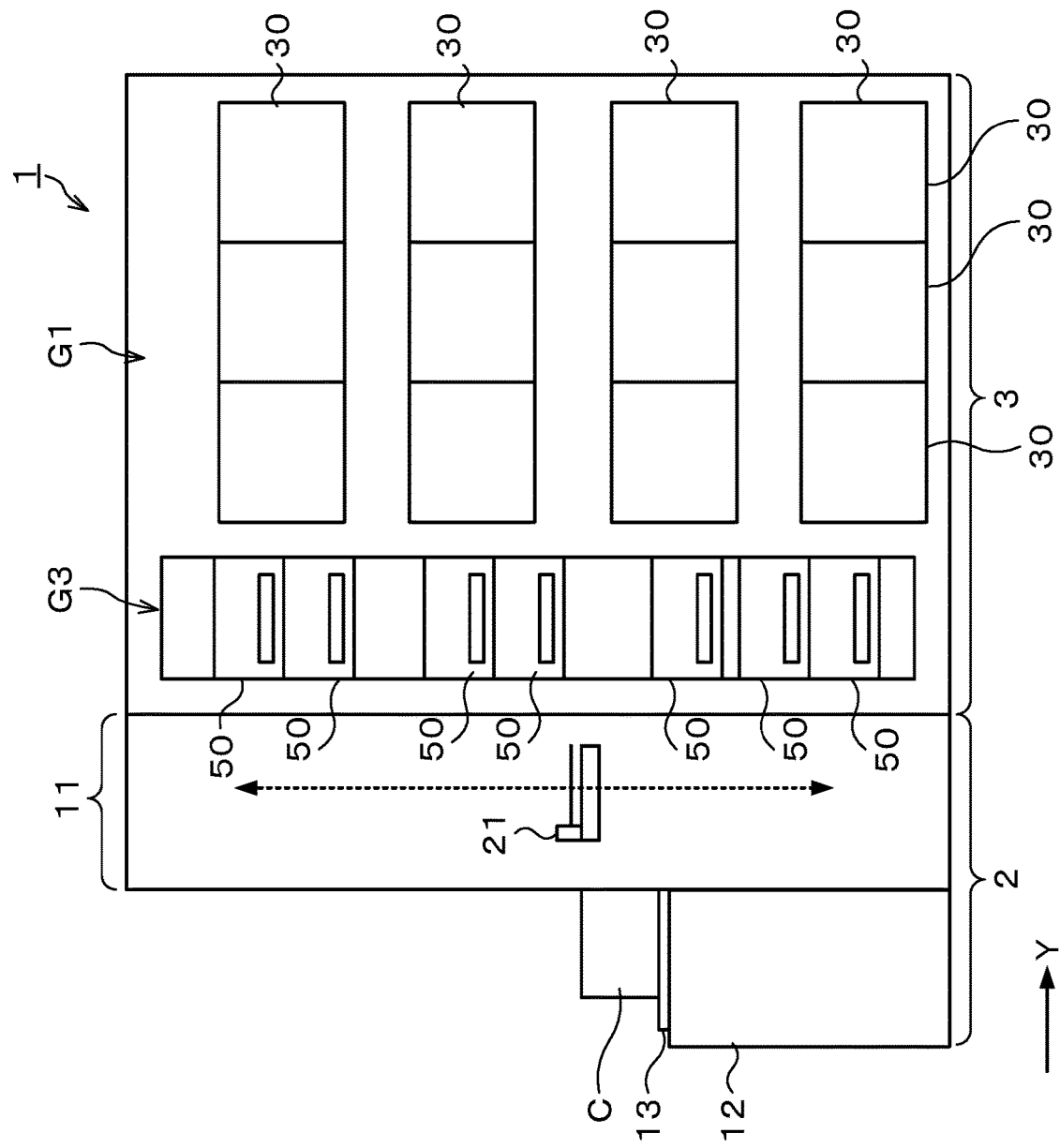
FIG. 2 is a view schematically illustrating the internal configurations on the front side of the wafer treatment system in FIG. 1.
Figure 3:
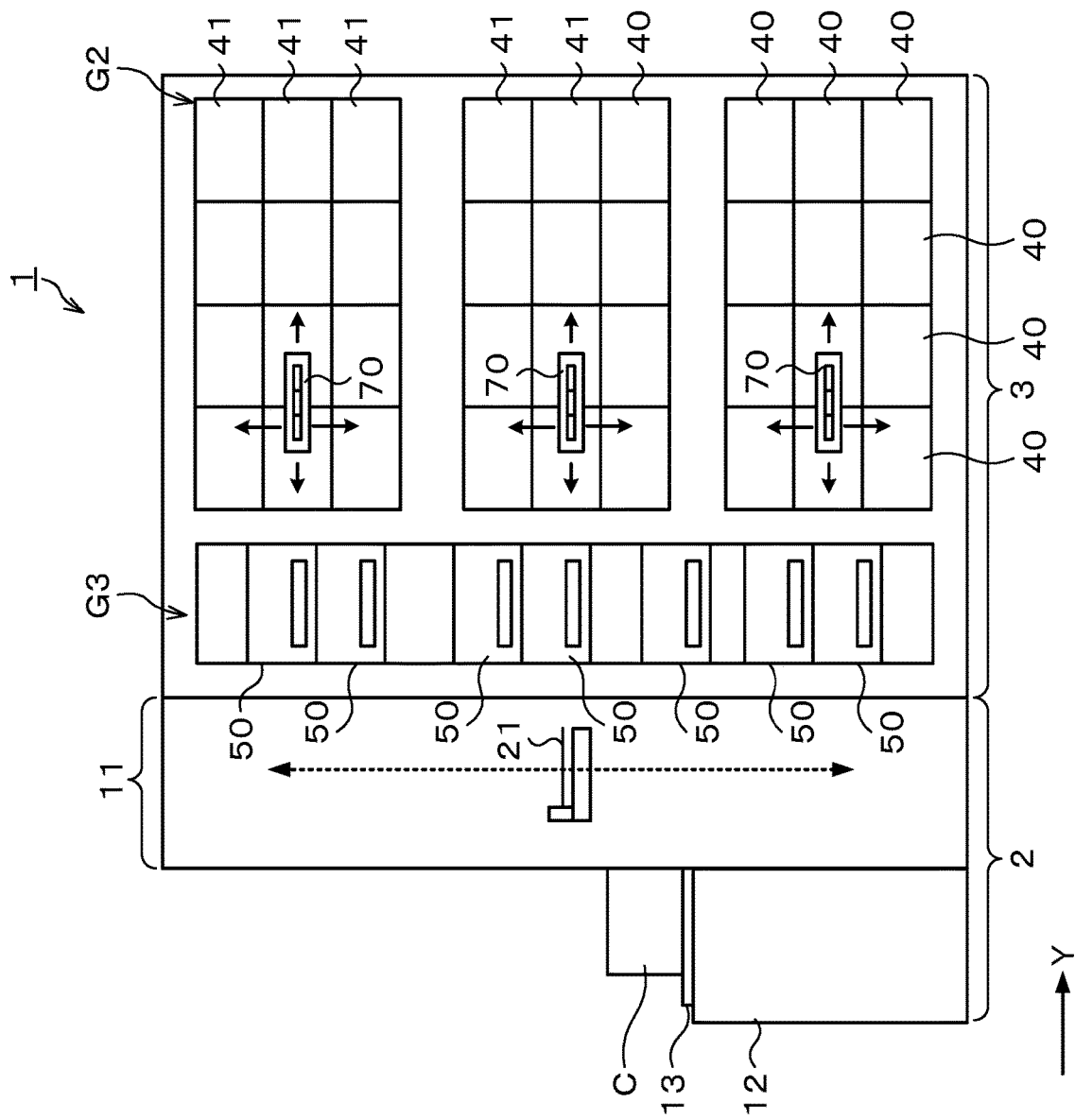
FIG. 3 is a view schematically illustrating the internal configurations on the rear side of the wafer treatment system in FIG. 1.

FIG. 1 is a plan view illustrating the outline of an internal configuration of a wafer treatment system 1 as a substrate treatment system according to a first embodiment. FIG. 2 and FIG. 3 are views schematically illustrating the internal configurations on the front side and the rear side of the wafer treatment system 1 in FIG. 1, respectively.

As illustrated in FIG. 1, the wafer treatment system 1 has a cassette station 2 into/out of which a cassette C housing a plurality of wafers W is transferred, and a treatment station 3 including a plurality of treatment apparatuses which perform predetermined treatments on the wafer W. The wafer treatment system 1 has a configuration in which the cassette station 2 and the treatment station 3 are integrally connected. Further, the wafer treatment system 1 has a control device 4 which controls the wafer treatment system 1.

The cassette station 2 is divided, for example, into a cassette transfer in/out section 10 and a wafer transfer section 11. The cassette transfer-in/out section 10 is provided, for example, at an end on a Y-direction negative direction (left direction in FIG. 1) side of the wafer treatment system 1. In the cassette transfer-in/out section 10, a cassette stage 12 is provided. On the cassette stage 12, a plurality of, for example, four stage plates 13 are provided. The stage plates 13 are provided side by side in a row in an X-direction being a horizontal direction (an up-down direction in FIG. 1). On the stage plates 13, cassettes C can be mounted when the cassettes C are transferred in/out from/to the outside of the wafer treatment system 1.

In the wafer transfer section 11, a wafer transfer apparatus 21 is provided which is movable on a transfer path 20 extending in the X-direction as illustrated in FIG. 1. The wafer transfer apparatus 21 is movable also in an up-down direction and around a vertical axis (in a θ-direction), and can transfer the wafer W between the cassette C on each of the stage plates 13 and later-explained delivery apparatuses in a third block G3 in the treatment station 3.

In the treatment station 3, a plurality of, for example, first to third blocks G1, G2, G3 each including various apparatuses are provided. For example, the first block G1 is provided on the front side (an X-direction negative direction side in FIG. 1) in the treatment station 3, and the second block G2 is provided on the rear side (an X-direction positive direction side in FIG. 1) in the treatment station 3. Further, the third block G3 is provided on the cassette station 2 side (a Y-direction negative direction side in FIG. 1) in the treatment station 3.

In the first block G1, as illustrated in FIG. 2, a plurality of coating apparatuses 30 are provided to which removing apparatuses are applied. The coating apparatuses 30 are arranged one above the other in the vertical direction and side by side in the horizontal direction. Note that the number and the arrangement of the coating apparatuses 30 can be arbitrarily selected.

In the coating apparatus 30, for example, spin coating of forming a coating film on the wafer W using a coating solution is performed. In the spin coating, the coating solution is discharged, for example, from a coating nozzle onto the wafer W and the wafer W is rotated to diffuse the coating solution over the surface of the wafer W. Further, in the coating apparatus 30, a treatment of removing the coating film on a peripheral region of the wafer W is also performed. Note that the concrete configuration of the coating apparatus 30 will be explained later.

For example, in the second block G2, as illustrated in FIG. 3, thermal treatment apparatuses 40, 41 each of which performs a heat treatment on the wafer W are provided one above the other in the vertical direction and side by side in the horizontal direction. The numbers and the arrangement of the thermal treatment apparatuses 40, 41 can also be arbitrarily selected. Note that the concrete configuration of the thermal treatment apparatus 40 will be explained later.

In the third block G3, a plurality of delivery apparatuses 50 are provided.

A wafer transfer region D is formed in a region surrounded by the first block G1 to the third block G3 as illustrated in FIG. 1. In the wafer transfer region D, for example, a wafer transfer apparatus 60 is arranged.

The wafer transfer apparatus 60 has a transfer arm 60a movable, for example, in a Y-direction, a front-back direction, a θ-direction, and an up-down direction. The wafer transfer apparatus 60 can move in the wafer transfer region D to transfer the wafer W to each apparatus in the first block G1, the second block G2, and the third block G3 therearound. A plurality of the wafer transfer apparatuses 60 are disposed one above the other, for example, as illustrated in FIG. 3, and each of them can transfer the wafer W, for example, to a predetermined apparatus at a height of the same level in each of the blocks G1 to G3.

A wafer transfer apparatus 61 is provided on an X-direction positive direction side in the third block G3 as illustrated in FIG. 1. The wafer transfer apparatus 61 has a transfer arm 61a movable, for example, in a a front-back direction, a θ-direction, and an up-down direction. The wafer transfer apparatus 61 can vertically move while supporting the wafer W to transfer the wafer W to each of the delivery apparatuses 50 in the third block G3.

The aforementioned control device 4 is, for example, a computer including a CPU, a memory and the like, and has a program storage (not illustrated). In the program storage, a program for controlling the operations of the drive system of the above-explained various treatment apparatuses to perform a later-explained wafer treatment is stored. Note that the program may be the one that is recorded in a computer-readable storage medium and installed from the storage medium into the control device 4.

Figure 4:
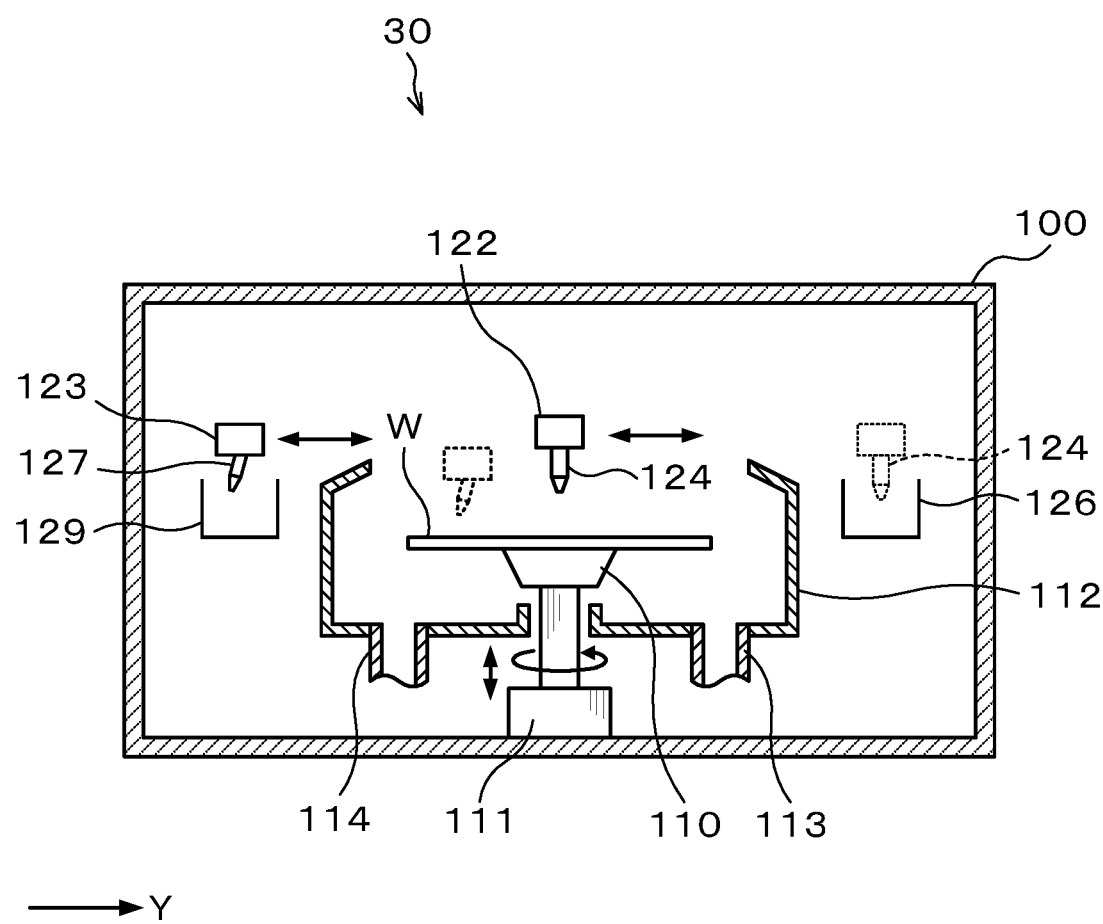
FIG. 4 is a longitudinal sectional view illustrating the outline of a configuration of a coating apparatus.
Figure 5:
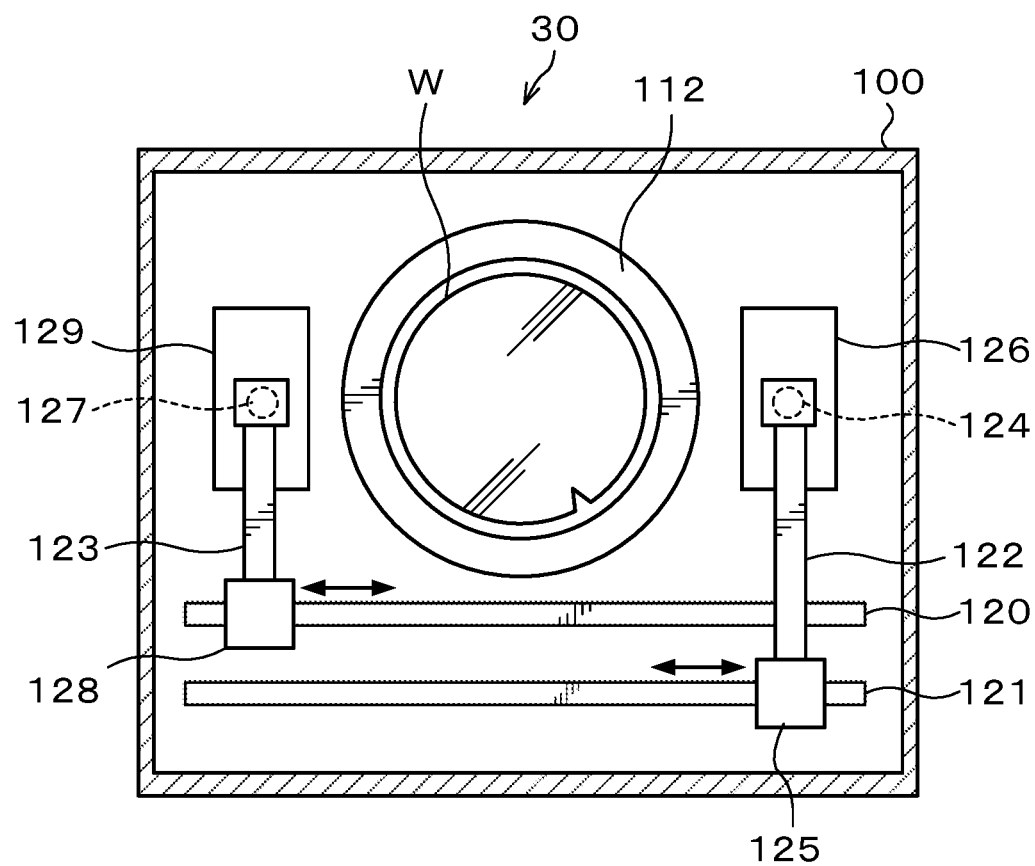
FIG. 5 is a transverse sectional view illustrating the outline of the configuration of the coating apparatus.

Next, the configuration of the aforementioned coating apparatus 30 will be explained. FIG. 4 and FIG. 5 are a longitudinal sectional view and a transverse sectional view illustrating the outline of the configuration of the coating apparatus 30, respectively.

The coating apparatus 30 has a treatment container 100 whose inside is sealable as illustrated in FIG. 4 and FIG. 5. A side surface on the wafer transfer apparatus 60 side of the treatment container 100 is formed with a transfer-in/out port (not illustrated) for the wafer W, and an opening and closing shutter (not illustrated) is provided at the transfer-in/out port.

At a center portion in the treatment container 100, a spin chuck 110 as a substrate holder is provided. The spin chuck 110 is intended to hold the wafer W and is configured to be rotatable. The spin chuck 110 has a horizontal upper surface, and the upper surface is provided with, for example, a suction port (not illustrated) for sucking the wafer W. By suction through the suction port, the wafer W can be suction-held on the spin chuck 110.

Below the spin chuck 110, a chuck drive 111 as a rotation mechanism is provided. The chuck drive 111 includes, for example, a motor or the like and can rotate the spin chuck 110 at a desired speed, so that the wafer W held on the spin chuck 110 can be rotated at a desired speed. Further, the chuck drive 111 is provided with, for example, a raising and lowering drive source such as a cylinder so that the spin chuck 110 freely rises and lowers.

Around the spin chuck 110, a cup 112 is provided which receives and collects liquid splashing or dropping from the wafer W. A drain pipe 113 which drains the collected liquid and an exhaust pipe 114 which evacuates and exhausts the atmosphere in the cup 112 are connected to the lower surface of the cup 112.

As illustrated in FIG. 5, on an X-direction negative direction (lower direction in FIG. 5) side of the cup 112, rails 120, 121 are formed which extend along a Y-direction (a right-left direction in FIG. 5). The rails 120, 121 are formed, for example, from an outer position on the Y-direction negative direction (left direction in FIG. 5) side to an outer position on the Y-direction positive direction (right direction in FIG. 5) side of the cup 112. To the rails 120, 121, a first arm 122 and a second arm 123 are attached, respectively.

On the first arm 122, a PI discharge nozzle 124 is supported which discharges a polyimide solution for forming a polyimide film as the coating solution and supplies the polyimide solution onto the wafer W as illustrated in FIG. 4 and FIG. 5. The viscosity of the polyimide solution supplied from the PI discharge nozzle 124 to the wafer W is high and, concretely, 1000 cp or higher.

The first arm 122 is movable on the rail 120 by a nozzle drive 125 illustrated in FIG. 5. This allows the PI discharge nozzle 124 to move from a waiting section 126 provided at an outer position on the Y-direction positive direction side of the cup 112 to a position above a center portion of the wafer W in the cup 112. Further, the first arm 122 is movable up and down by the nozzle drive 125, and is able to adjust the height of the PI discharge nozzle 124.

To the PI discharge nozzle 124, a supply source (not illustrated) of the polyimide solution is connected. Further, a supply pipe (not illustrated) between the PI discharge nozzle 124 and the supply source of the polyimide solution is provided with a supply equipment group including a valve, a flow regulator and so on for controlling the flow of the polyimide solution.

On the second arm 123, a solvent discharge nozzle 127 as a discharger is supported as illustrated in FIG. 4 and FIG. 5. The solvent discharge nozzle 127 discharges a solvent for the polyimide film as a removing solution for removing a peripheral portion of the polyimide film formed on the surface of the wafer W, and supplies the solvent onto the wafer W. The solvent discharged from the solvent discharge nozzle 127 is, for example, N-methyl-2-pyrrolidone.

The second arm 123 is movable on the rail 121 by a nozzle drive 128 as a moving mechanism illustrated in FIG. 5. This allows the solvent discharge nozzle 127 to move from a waiting section 129 provided at an outer position on the Y-direction negative direction side of the cup 112 to a position above a peripheral region of the wafer W in the cup 112. Further, the second arm 123 is movable up and down by the nozzle drive 128, and is able to adjust the height of the solvent discharge nozzle 127.

To the solvent discharge nozzle 127, a supply source (not illustrated) of the solvent is connected. Further, a supply pipe (not illustrated) between the solvent discharge nozzle 127 and the supply source of the solvent is provided with a supply equipment group including a valve, a flow regulator and so on for controlling the flow of the solvent.

Note that the PI discharge nozzle 124 discharges the polyimide solution downward in the vertical direction, namely, vertically to the horizontal plane, whereas the solvent discharge nozzle 127 discharges the removing solution diagonally with respect to the horizontal plane. Further, the solvent discharge nozzle 127 has a discharge port inclined toward the outside of the wafer W.

Figure 6:
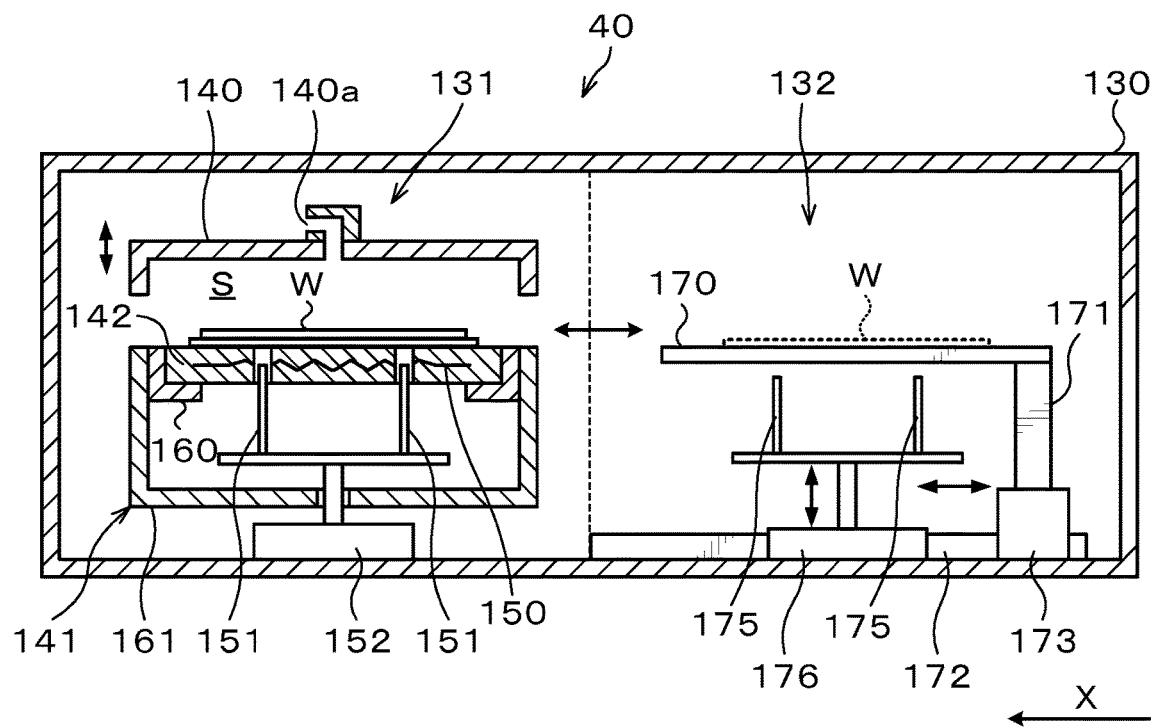
FIG. 6 is a longitudinal sectional view illustrating the outline of a configuration of a thermal treatment apparatus.
Figure 7:
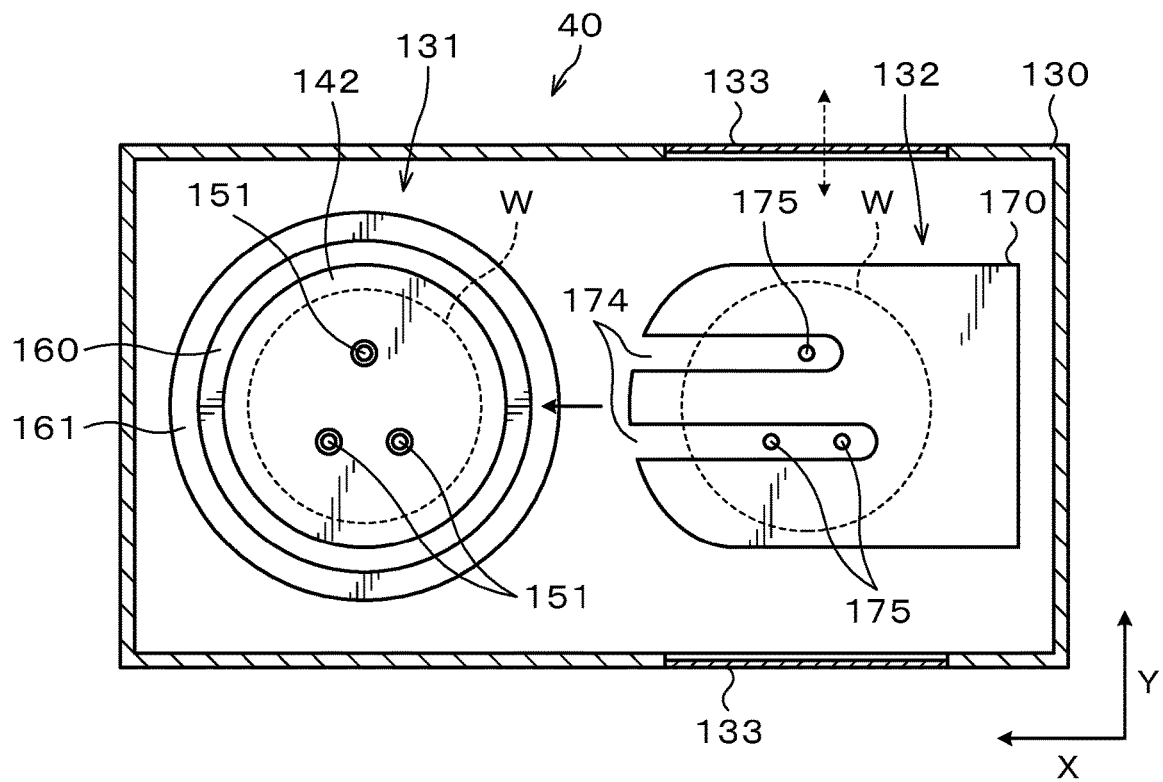
FIG. 7 is a transverse sectional view illustrating the outline of the configuration of the thermal treatment apparatus.

Next, the configuration of the thermal treatment apparatus 40 will be explained. FIG. 6 and FIG. 7 are a longitudinal sectional view and a transverse sectional view illustrating the outline of the configuration of the thermal treatment apparatus 40.

As illustrated in FIG. 6 and FIG. 7, the thermal treatment apparatus 40 includes in a housing 130, for example, a heating section 131 which performs a heat treatment on the wafer W and a cooling section 132 which performs a cooling treatment on the wafer W. As illustrated in FIG. 7, both side surfaces near the cooling section 132 of the housing 130 are formed with transfer-in/out ports 133 for transferring in/out the wafer W.

The heating section 131 includes a lid 140 which is located on the upper side and movable up and down, and a hot plate accommodator 141 which is located on the lower side and unites with the lid 140 to form a treatment chamber S as illustrated in FIG. 6.

The lid 140 has an almost cylindrical shape with a lower surface open, and covers an upper surface of the wafer W mounted on a later-explained hot plate 142. At the center portion of an upper surface of the lid 140, an exhaust part 140a is provided. The atmosphere inside the treatment chamber S is exhausted from the exhaust part 140a.

At the middle of the hot plate accommodator 141, the hot plate 142 is provided on which the wafer W is mounted and which heats the mounted wafer W. The hot plate 142 has a thick and almost disk shape, and a heater 150 which heats the upper surface of the hot plate 142, namely, a mounting surface for the wafer W is provided therein, and can regulate the hot plate 142 to a set temperature. As the heater 150, for example, an electric heater is used.

In the hot plate accommodator 141, raising and lowering pins 151 are provided which penetrate the hot plate 142 in the thickness direction. The raising and lowering pins 151 freely rise and lower by a raising and lowering drive 152 such as a cylinder and can project to above the upper surface of the hot plate 142 to deliver the wafer W to/from the later-explained cooling plate 170.

Note that when the wafer W is delivered between the hot plate 142 and the cooling plate 170, the lid 140 is raised. Further, when the wafer W is delivered to the hot plate 142 and the wafer W is heated on the hot plate 142, the lid 140 is lowered to form the treatment chamber S.

The hot plate accommodator 141 has, for example, an annular holding member 160 which accommodates the hot plate 142 and holds the outer peripheral portion of the hot plate 142, and an almost cylindrical support ring 161 which surrounds the outer periphery of the holding member 160 as illustrated in FIG. 6.

In the cooling section 132 adjacent to the heating section 131, for example, the cooling plate 170 which mounts and cools the wafer W thereon is provided. The cooling plate 170 has an almost square flat plate shape, and has an end face on the heating section 131 side curved in an arc shape as illustrated in FIG. 7. A cooling member (not-illustrated) such as a Peltier element is built in the cooling plate 170 and can regulate the cooling plate 170 to a set temperature.

The cooling plate 170 is supported, for example, by a supporting arm 171 and the supporting arm 171 is attached to a rail 172 extending toward the X-direction on the heating section 131 side as illustrated in FIG. 6. The cooling plate 170 can move on the rail 172 by a drive mechanism 173 attached to the supporting arm 171. Thus, the cooling plate 170 can move to a position above the hot plate 142 on the heating section 131 side.

The cooling plate 170 is formed with, for example, two slits 174 along the X-direction in FIG. 7. The slits 174 are formed from the end face on the heating section 131 side of the cooling plate 170 to the vicinity of the middle of the cooling plate 170. The slits 174 prevent the interference between the cooling plate 170 moved to the heating section 131 side and the raising and lowering pins 151 above the hot plate 142. As illustrated in FIG. 6, below the cooling plate 170 located in the cooling section 132, raising and lowering pins 175 are provided. The raising and lowering pins 175 can rise and lower by a raising and lowering drive 176. The raising and lowering pins 175 can rise from below the cooling plate 170, pass through the slits 174, project to above the cooling plate 170, and deliver the wafer W, for example, to/from the wafer transfer apparatus 60 entering the inside of the housing 130 from the transfer-in/out port 133.

Note that the configuration of the thermal treatment apparatus 41 is the same as that of the thermal treatment apparatus 40, and therefore its explanation will be omitted. Further, the timing of use is different between the thermal treatment apparatus 40 and the thermal treatment apparatus 41, but the set temperatures of their hot plates 142 are substantially the same. Specifically, the difference in the set temperature of the hot plate 142 between the thermal treatment apparatus 40 and the thermal treatment apparatus 41 is 10° C. or lower.

Figure 8:
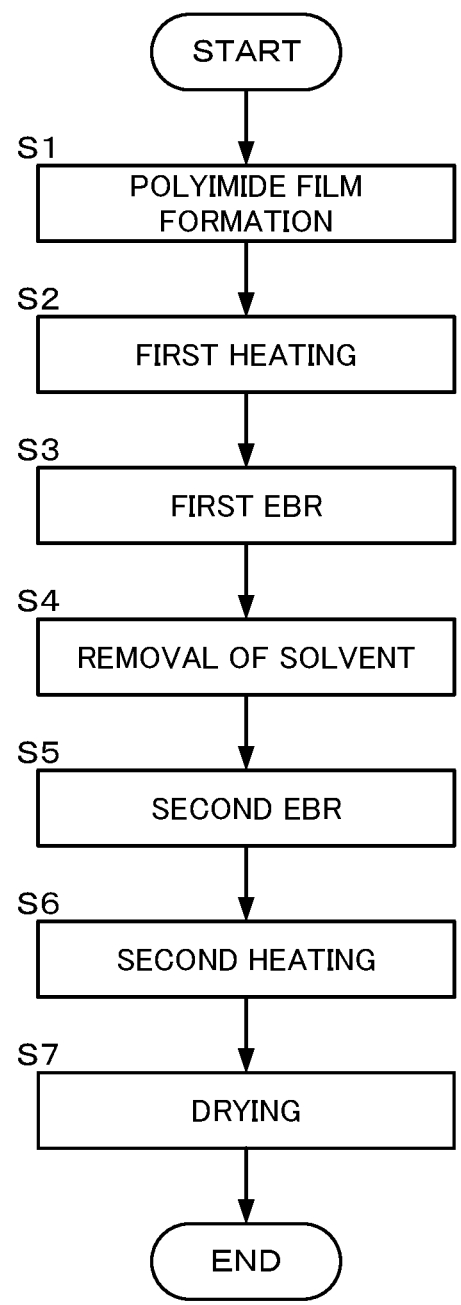
FIG. 8 is a flowchart for explaining an example of a wafer treatment in the wafer treatment system in FIG. 1.
Figure 9:
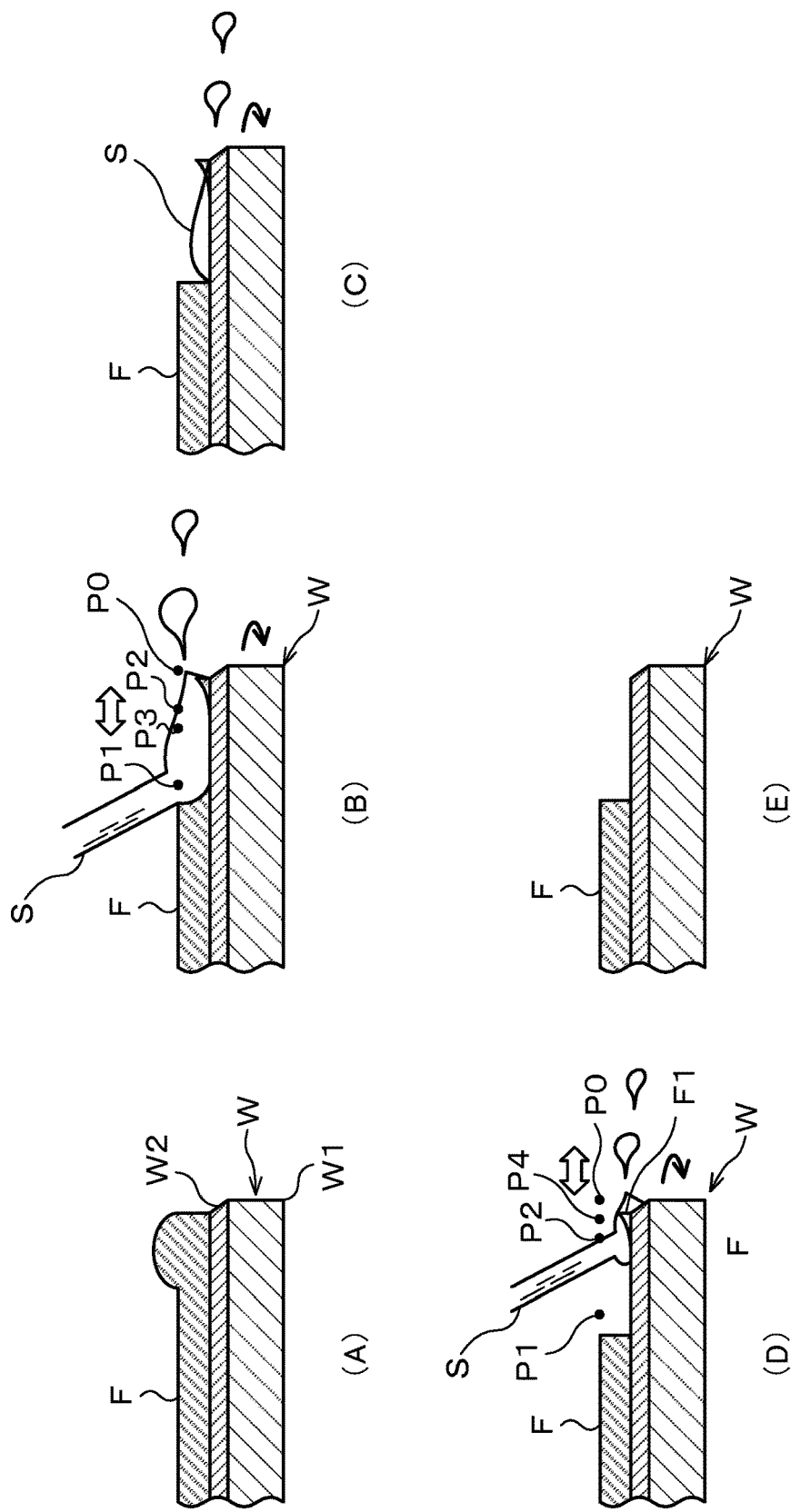
FIG. 9 is a view illustrating the state of a wafer outer peripheral region in the wafer treatment.

Next, the wafer treatment in the wafer treatment system 1 will be explained. FIG. 8 is a flowchart for explaining an example of the wafer treatment in the wafer treatment system 1. FIG. 9 is a view illustrating the state of the wafer outer peripheral region in the wafer treatment.

(Polyimide Film Forming Step)

First, a polyimide solution is supplied onto the wafer W to form a polyimide film on the wafer surface, for example, under the control of the control device 4 (Step S1).

Concretely, a wafer W to be treated is taken out of the cassette C on the cassette stage 12, transferred to the coating apparatus 30 in the first block G1 in the treatment station 3, and suction-held on the spin chuck 110. Note that the wafer W to be treated in the wafer treatment system 1 is the one in which a SiN film is formed on a surface of a bare silicon substrate as illustrated, for example, in FIG. 9(A).

Subsequently, the PI discharge nozzle 124 on the waiting section 126 moves to a position above a center portion of the wafer W suction-held on the spin chuck 110 under the control of the control device 4. Thereafter, the polyimide solution is discharged from the PI discharge nozzle 124 in a state where the wafer W is being rotated by the spin chuck 110 and supplied onto the surface of the wafer W. The supplied polyimide solution is diffused over the entire surface of the wafer W by centrifugal force to form a polyimide film on the surface of the wafer W. Here, the polyimide film is formed such that a film thickness of the polyimide film after a later-explained second heating step becomes 10 μm or more.

Note that, as illustrated in FIG. 9(A), a polyimide film F is formed in a manner to swell in the vicinity of the periphery of the wafer W in the polyimide film forming step.

(First Heating Step)

Subsequently, the wafer W on which the polyimide film is formed is heated in the thermal treatment apparatus 40 under the control of the control device 4 (Step S2).

More specifically, after the formation of the polyimide film in the coating apparatus 30, the wafer W is transferred to the thermal treatment apparatus 40, and mounted and heated on the hot plate 142 temperature-regulated at the set temperature. This makes the polyimide film into a hardened state lower than a target thermal hardened state and have appropriate meltability with respect to the solvent. In this heating step, for example, heating is performed during a time to an extent at which the polyimide film does not lose its shape in later-explained first EBR step and second EBR step, namely, at which the flowability of the polyimide solution on the surface of the wafer is lost.

Note that the set temperature of the hot plate 142 in the thermal treatment apparatus 40 used for heating the wafer W in the first heating step is, for example, 100° C. to 150° C.

(First EBR Step)

Next, a removal treatment of the polyimide film on the peripheral region of the wafer surface is performed in the coating apparatus 30 (Step S3). Specifically, in the coating apparatus 30, the discharge destination of a solvent S from the solvent discharge nozzle 127 is moved in a range from a first position P1 different from a peripheral position P0 on the surface of the wafer W to the peripheral position P0 in a state where the wafer W is being rotated as illustrated in FIG. 9(B). More specifically, in the state where the wafer W is being rotated, the discharge destination of the solvent S from the solvent discharge nozzle 127 is moved from the peripheral position P0 on the surface of the wafer W toward the wafer center side, and then turned back at the first position P1 in the wafer peripheral region, and returned again to the peripheral position P0.

More specifically, after the heating in the thermal treatment apparatus 40, the wafer W is transferred to the coating apparatus 30, and suction-held on the spin chuck 110. Subsequently, the wafer W is rotated by the spin chuck 110, and the solvent discharge nozzle 127 on the waiting section 129 is moved to a position above the vicinity of the peripheral region of the wafer W suction-held on the spin chuck 110. Thereafter, the discharge of the solvent from the solvent discharge nozzle 127 is started, and the solvent discharge nozzle 127 is continuously moved at a constant speed toward the center portion of the wafer W so that the discharge destination of the solvent S reaches the first position P1 from the outside of the wafer W through the peripheral position P0. Then, when the discharge destination of the solvent reaches the first position P1, the movement of the solvent discharge nozzle 127 is stopped for a predetermined time in a state where the discharge of the solvent is continued. Note that the first position P1 is set so that the removal width of the polyimide film takes a desired value.

Next, the solvent discharge nozzle 127 is moved toward the outside of the wafer W so that the discharge destination of the solvent is returned to the outside of the wafer W through the peripheral position P0. First, the movement of the solvent discharge nozzle 127 is stopped for a predetermined time in a state where the discharge of the solvent is continued every time the solvent discharge nozzle 127 is moved by a predetermined distance until the discharge destination of the solvent reaches a third position P3 on the side closer to the wafer center than a later-explained second position P2. The above predetermined distance, namely, a stop interval of the solvent discharge nozzle 127 is, for example, 0.5 mm to 1.0 mm, and the distance between the second position P2 and the third position P3 is equal to the above stop interval. Further, the solvent discharge nozzle 127 is continuously moved at a constant speed until the discharge destination of the solvent reaches the outside of the wafer W in a state where the discharge of the solvent is continued after the discharge destination of the solvent is stopped for a predetermined time at the third position P3.

In the above manner, in the first EBR step, when the discharge destination of the solvent S is moved to return to the peripheral position P0, the solvent discharge nozzle 127 is continuously moved at a constant speed for a portion where the discharge range of the solvent is overlapped with that in the second EBR step, whereas the solvent discharge nozzle 127 is moved in stages for a portion where the discharge range of the solvent is not overlapped.

Note that the number of rotations of the wafer W in the first EBR step is, for example, 1000 to 2000 rpm, and the flow rate of the solvent discharged from the solvent discharge nozzle 127 is 10 to 20 ml/min.

(Solvent Removing Step)

After the removal of the peripheral portion of the polyimide film in Step S3, the removal of the solvent solution on the wafer W is performed in the coating apparatus 30 (Step S4). Specifically, in a state where the supply of the solvent to the wafer surface is stopped, the wafer W is rotated at a number of rotations higher than those in the first EBR step and in the later-explained second EBR step.

More specifically, the discharge of the solvent from the solvent discharge nozzle 127 is stopped, the solvent discharge nozzle 127 is moved onto the waiting section 129, the number of rotations of the spin chuck 110 is increased, and the number of rotations of the wafer W is increased up to a predetermined number of rotations and maintained in this state for a predetermined time. This shakes off and removes the solvent S containing a dissolved matter of the polyimide film existing on a peripheral region of the wafer W as illustrated in FIG. 9(C).

Note that the number of rotations of the wafer W in this step is, for example, 1.5 to 2.5 times those in the first EBR step and the second EBR step, namely, 1500 to 5000 rpm.

(Second EBR Step)

Next, a removal treatment of the polyimide film on the peripheral region of the wafer surface is performed again in the coating apparatus 30 (Step S5). Specifically, in the coating apparatus 30, the discharge destination of the solvent S from the solvent discharge nozzle 127 is moved in a range from the second position P2 on the side closer to the outside than the first position P1 to the peripheral position P0 in a state where the wafer W is being rotated as illustrated in FIG. 9(D). More specifically, in the state where the wafer W is being rotated, the discharge destination of the solvent S from the solvent discharge nozzle 127 is moved from the peripheral position P0 on the surface of the wafer W toward the center side of the wafer W, and then turned back at the second position P2 on the side closer to the outside than the first position P1, and returned again to the peripheral position P0.

More specifically, the number of rotations of the wafer W by the spin chuck 110 in decreased, and the solvent discharge nozzle 127 on the waiting section 129 is moved to a position above the vicinity of the peripheral region of the wafer W. Thereafter, the discharge of the solvent from the solvent discharge nozzle 127 is started, and the solvent discharge nozzle 127 is continuously moved at a constant speed toward the center portion of the wafer W so that the discharge destination of the solvent reaches the second position P2 from the outside of the wafer W through the peripheral position P0. Then, when the discharge destination of the solvent reaches the second position P2, the movement of the solvent discharge nozzle 127 is stopped for a predetermined time in a state where the discharge of the solvent is continued. Note that the second position P2 is a position at 1.0 to 1.5 mm from the edge, namely, a side end surface of the wafer W, for example, in the case where the diameter of the wafer W is 300 mm.

Next, the solvent discharge nozzle 127 is moved toward the outside of the wafer W so that the discharge destination of the solvent is returned to the outside of the wafer W through the peripheral position P0. First, the movement of the solvent discharge nozzle 127 is stopped for a predetermined time in a state where the discharge of the solvent is continued every time the solvent discharge nozzle 127 is moved by a predetermined distance until the discharge destination of the solvent reaches a fourth position P4 on the side closer to the outside than the second position P2. The above predetermined distance, namely, a stop interval of the solvent discharge nozzle 127 is, for example, 0.5 mm to 1.0 mm. Further, the solvent discharge nozzle 127 is continuously moved at a constant speed until the discharge destination of the solvent reaches the outside of the wafer W in a state where the discharge of the solvent is continued after the discharge destination of the removing solution is stopped for a predetermined time at the fourth position P4.

Even if the polyimide film F remains at an outside portion in the wafer peripheral region being the removal region of the coating film on the wafer W, namely, even if a residual polyimide film F1 exists at a time point when the steps before this step are ended, the residual polyimide film F1 can be removed in this step.

Note that the second EBR step is almost the same step as the first EBR step as is clear from the above, but the turn back position in the route of the discharge destination of the solvent from the solvent discharge nozzle 127 is different.

Further, the number of rotations of the wafer W in the second EBR step is almost the same as that in the first EBR step such as 1000 to 2000 rpm, and the difference from the number of rotations of the wafer W in the first EBR step is, for example, 300 rpm or less. Further, in the second EBR step, the flow rate of the solvent discharged from the solvent discharge nozzle 127 is 10 to 20 ml/min.

(Drying Step)

After the removal of the peripheral portion of the polyimide film in Step S5, drying processing of the wafer W is performed in the coating apparatus 30 (Step S6). Specifically, the wafer W is rotated at a number of rotations higher than those in the first EBR step and the second EBR step in a state where the supply of the solvent to the wafer surface is stopped.

More specifically, the discharge of the solvent from the solvent discharge nozzle 127 is stopped, the solvent discharge nozzle 127 is moved onto the waiting section 129, the number of rotations of the spin chuck 110 is increased, and the number of rotations of the wafer W is increased up to a predetermined number of rotations and maintained in this state for a predetermined time. This dries the wafer W and makes a state where the polyimide film F does not exist any longer on the peripheral region of the wafer W as illustrated in FIG. 9(E).

Note that the number of rotations of the wafer W in this step is, for example, 1500 to 5000 rpm.

(Second Heating Step)

Subsequently, the dried wafer W is heated in the thermal treatment apparatus 41 under the control of the control device 4 (Step S6).

More specifically, after the drying of the wafer W in the coating apparatus 30, the wafer W is transferred to the thermal treatment apparatus 41, and mounted and heated on the hot plate 142 temperature-regulated at the set temperature. Here, the heating is performed so that the polyimide film is further hardened and has a predetermined film thickness.

Note that the set temperature of the hot plate 142 in the thermal treatment apparatus 41 used for heating the wafer W in the second heating step is, for example, 100° C. to 150° C. similar to the hot plate of the thermal treatment apparatus 40 used for heating the wafer W in the first heating step.

After the second heating step, the wafer W is returned to the cassette C. With this, a series of wafer treatments in the wafer treatment system 1 is ended.

Note that the wafer W returned to the cassette C is subjected to, for example, formation of a circuit pattern on the polyimide film by the photolithography processing, for example, in another wafer treatment system. Then, the polyimide film on the wafer is peeled from the wafer W and used as a flexible circuit board.

Next, the effects of the wafer treatment according to this embodiment will be explained.

In the case of forming a thick coating film on the wafer W using a coating solution having high viscosity and performing the conventional EBR treatment, it is necessary to perform a heat treatment on the wafer before the EBR treatment. This is because unless the coating film is hardened by the heat treatment, the shape of a side end portion of the coating film formed in the EBR step is deteriorated afterwards. However, in the earnest investigation by the present inventors, when the time of the heat treatment of the wafer was excessively increased, the residue of the coating solution was sometimes produced in the peripheral region of the wafer after the EBR treatment. Further, by the earnest investigation by the present inventors, it was revealed that when the heat treatment for the wafer was performed separately before and after the conventional EBR treatment, it was possible to prevent the production of the residue of the coating solution without deteriorating the shape of the side end portion of the coating film formed in the EBR step by appropriately setting the heating time or the like before the EBR treatment. However, even with the appropriate setting as above, there was a case where the residue of the coating solution was produced at an outer portion in the removal region of the coating film on the wafer W depending on the length of time after the heat treatment before the EBR treatment until before the start of the EBR treatment. The above outer portion in the removal region of the coating film on the wafer W is, for example, a portion of 0.8 to 1.2 mm from the edge, namely, the side end surface of the wafer W when the diameter of the wafer W is 300 mm. Note that the considerable reason why the residue is produced when the time after the heat treatment before the EBR treatment until before the start of the EBR is long is, for example, that even if the coating film just after the heat treatment before the EBR treatment is in a wet state, the coating film is dried and solidified until before the start of the EBR treatment or the like.

In consideration of the above point, the wafer treatment according to this embodiment includes: a first heating step of heating the wafer having a polyimide film formed on its surface by the supply of the polyimide solution; a first EBR step of, after the first heating step, changing the discharge destination of the solvent S from the solvent discharge nozzle 127 in a range from the first position P1 different from the peripheral position P0 on surface of the wafer W to the peripheral position P0 while rotating the wafer W; a second EBR step of, after the first EBR step, changing the discharge destination of the solvent in a range from the second position P2 on the side closer to the outside than the first position P1 to the peripheral position P0 while rotating the wafer W; and a second heating step of, after the second EBR step, heating again the wafer W.

In other words, in the wafer treatment according to this embodiment, the step of heating the wafer is divided into steps before and after the EBR treatment including the above first EBR step and second EBR step, namely, into the above first heating step and second heating step. In the wafer treatment according to this embodiment, the EBR treatment includes the above first EBR step and second EBR step in which the solvent is intensively discharged to the outer portion in the removal region of the polyimide film on the wafer W. Accordingly, only by appropriately setting the times of the above first heating step and second heating step, it is possible to prevent the production of the residue of the polyimide solution irrespective of the length or the like of the time after the first heating step until before the start of the EBR treatment, namely, the time after the above first heating step until before the start of the first EBR treatment.

Further, the wafer treatment according to this embodiment includes the step of rotating the wafer at a number of rotations higher than those in the above first EBR step and second EBR step in a state where the supply of the removing solution to the surface of the wafer W is stopped before the above first EBR step and the above second EBR step. Thus, the solvent containing the dissolved material of the polyimide film produced in the first EBR step is shaken off and removed from the wafer W, so that the residue caused from the solvent containing the dissolved material is never produced in the region on the side closer to the wafer center portion than the second position P2, namely, the inside region on the wafer surface.

Furthermore, in the above second EBR step performed after the above first EBR step, the turn back position of the moving path of the discharge destination of the polyimide solution is the second position P2 on the side inner than the first position P1 that is the same turn back position in the above first EBR step. Accordingly, an end portion of the polyimide film formed in the above first EBR step is never dissolved in the second EBR step and never remains on the wafer as a residue.

Further, in the wafer treatment according to this embodiment, the temperature of the hot plate 142 which heats the wafer W is almost the same in the above first heating step and the above second heating step. Accordingly, in the case where a plurality of hot plates 142 at almost the same temperature are provided as above to successively treat a plurality of wafers W, the wafer W can be treated by the hot plate 142 which is next available. In addition, since the hot plates 142 are on the same condition about the temperature influence on the peripheral environments, it is easy to suppress the thermal influence between the adjacent hot plates 142, and to uniform the thermal influences of the atmospheres in the transfer paths for the wafer W exerted on the wafer W even when the wafer W is treated on any of the hot plates 142. Further, when the first heating step and the second heating step are performed by the same hot plate 142 unlike the above example, the time required to change the temperature of the hot plate 142 is short, thus enabling rapid treatment. Especially, in the case where there is no temperature difference, it is not necessary to change the temperature of the hot plate 142, thus enabling more rapid treatment.

Furthermore, in the wafer treatment according to this embodiment, the solvent discharge nozzle 127 is continuously moved at a constant speed when the discharge destination of the solvent S is moved to return from the first position P1 to the peripheral position P0 in the first EBR step, for the portion where the discharge range of the solvent is overlapped with that in the second EBR step. In addition, the solvent discharge nozzle 127 is moved in stages for the portion where the discharge range of the solvent is not overlapped. Accordingly, it is possible to reduce the time required for the entire EBR treatment including the first EBR step and the second EBR step as compared with the case where the solvent discharge nozzle 127 is moved in stages at all times when the discharge destination of the solvent S is moved to return from the first position P1 to the peripheral position P0 in the above first EBR step.

Second Embodiment

Figure 10:
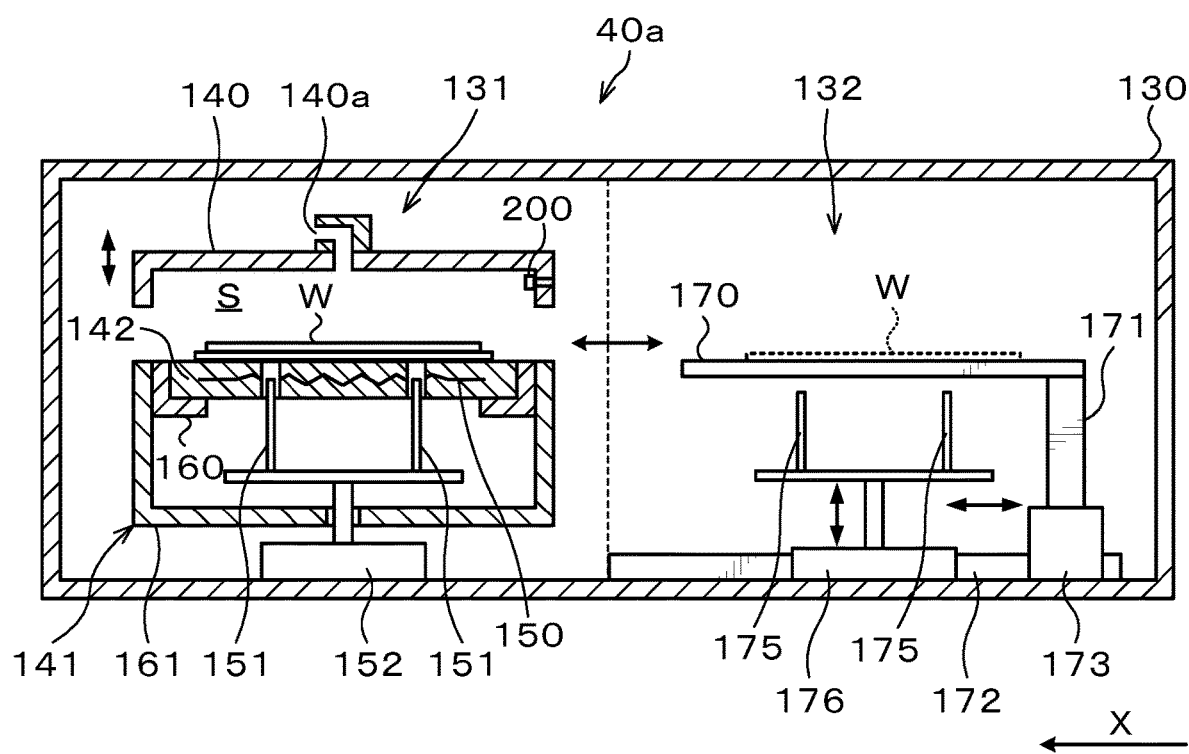
FIG. 10 is a longitudinal sectional view illustrating the outline of a configuration of a thermal treatment apparatus included in a wafer treatment system as a substrate treatment system according to a second embodiment.

FIG. 10 is a longitudinal sectional view illustrating the outline of a configuration of a thermal treatment apparatus 40*a* included in a wafer treatment system as a substrate treatment system according to a second embodiment.

The wafer treatment system according to the first embodiment and the wafer treatment system according to this embodiment are different in configuration of the thermal treatment apparatus.

The thermal treatment apparatus 40*a* included in the wafer treatment system in this embodiment, unlike the above-explained thermal treatment apparatus 40, has a pressure sensor 200 provided, as a monitoring means for monitoring the treatment state of the wafer W in the first heating step, at the lid 140 constituting the treatment chamber S as illustrated in FIG. 10.

Besides, the wafer treatment in the wafer treatment system according to this embodiment further includes a step of monitoring the thermal treatment state of the wafer W in the first heating step. Specifically, in the first heating step, the thermal treatment state of the wafer W in the first heating step is monitored using the pressure sensor 200. This is because the volatile amount of the solvent for the polyimide solution varies according to the thermal treatment state of the wafer W in the first heating step, and as a result, the pressure in the treatment chamber S varies.

The monitoring result of the thermal treatment state of the wafer W in the first heating step is used, for example, for the correction of the treatment condition (for example, the thermal treatment time) in the first heating step on a wafer W to be treated after the former wafer. Specifically, for example, when the pressure detected by the pressure sensor 200 is lower than an appropriate value and the thermal treatment in the first heating step is insufficient at a time point when a predetermined time has elapsed from the start of the thermal treatment of the wafer W, the thermal treatment time in the first heating step for a wafer W to be treated afterwards is corrected so as to be longer. Note that the above appropriate value is set in advance according to, for example, a target film thickness or the like of the polyimide film, and stored in a storage (not illustrated).

Further, the monitoring result of the thermal treatment state of the wafer W in the first heating step may be used for the correction of the treatment condition (for example, the solvent supply time) in at least one of the first EBR step and the second EBR step for the wafer W. In the first EBR step, there is a period when the solvent discharge nozzle 127 is fixed for a predetermined time in a state where the discharge of the solvent is continued every time the solvent discharge nozzle 127 is moved by a predetermined distance. Accordingly, for example, when the pressure detected by the pressure sensor 200 at the end of the thermal treatment of the wafer W is lower than the appropriate value and the time of the thermal treatment in the first heating step is short, the above predetermined time in the first EBR step, namely, the solvent supply time at one place is corrected to be shorter.

Note that when the monitored thermal treatment state of the wafer W in the first heating step is not appropriate, specifically, when the value detected by the pressure sensor does not fall within an appropriate range, the fact may be notified. In this case, the notification may be made by a screen display using a display device (not illustrated), the notification may be made by sound (including voice) using an audio device (not illustrated) or the like, the notification may be made by light using an illumination device or the like, or another notification form may be employed.

Further, in the above, the thermal treatment state of the wafer W in the first heating step is monitored based on the detection result by the pressure sensor 200 provided at the lid 140 of the thermal treatment apparatus 40*a* used for the first heating step.

In place of this, the thermal treatment state of the wafer W in the first heating step may be monitored based on the detection result by a weight sensor provided at the hot plate 142 or the like. This is because the volatile amount of the solvent for the polyimide solution varies according to the thermal treatment state of the wafer W in the first heating step and, as a result, the weight of the wafer on the hot plate 142 varies.

Note that in the above, the polyimide solution is used as the coating solution. However, the technique according to this disclosure is useful not only for the case of using the polyimide solution but also for the case of forming a thick coating film having a film thickness of 10 μm or more using another coating solution having a high viscosity of 1000 cP or more.

In the above, the treatment of removing the coating film on the peripheral region of the wafer W is also performed in the coating apparatus 30 which performs the treatment of forming the polyimide film on the wafer W. In place of this, an apparatus which performs a treatment of removing the coating film on the peripheral region of the wafer W may be provided separately from an apparatus which performs a treatment of forming the polyimide film on the wafer W.

The embodiments disclosed herein are examples in all respects and should not be considered to be restrictive.

Various omissions, substitutions and changes may be made in the embodiments without departing from the scope and spirit of the attached claims.

Note that the following configurations also fall within the technical scope of the disclosure.

(1) A substrate treatment method for treating a substrate, including the steps of:
(A) heating the substrate having a coating film formed on a surface thereof by supply of a coating solution;
(B), after the (A) step, moving a discharge destination of a removing solution in a range from a first position different from a peripheral position on the surface of the substrate to the peripheral position while rotating the substrate;
(C), after the (B) step, moving the discharge destination of the removing solution in a range from a second position on a side closer to an outside than the first position to the peripheral position on the surface of the substrate while rotating the substrate;
(D), after the (C) step, heating again the substrate; and
(E), after the (B) step and before the (C) step, rotating the substrate at a number of rotations higher than numbers of rotations in the (B) step and the (C) step in a state where the supply of the removing solution to the surface of the substrate is stopped.

According to the (1), it is possible to prevent, when removing a peripheral portion of a coating film formed on a substrate surface, a residue from being produced in a peripheral region on the substrate surface even when the viscosity of a coating solution used for the formation of the coating film is high and the thickness of the coating film is large.

(2) The substrate treatment method according to the (1), wherein temperatures of the substrate in the (A) step and the (D) step are almost same.

(3) The substrate treatment method according to the (1) or (2), wherein the numbers of rotations of the substrate in the (B) step and the (C) step are almost same.

(4) The substrate treatment method according to any one of the (1) to (3), further including the step of (E) monitoring a treatment state of the substrate in the (A) step.

(5) The substrate treatment method according to the (4), wherein a treatment condition in the (A) step for a subsequent substrate is corrected based on a monitoring result of the treatment state.

(6) The substrate treatment method according to the (4) or (5), wherein a treatment condition in at least one of the (B) step and the (C) step subsequent to the (A) step is corrected based on a monitoring result of the treatment state in the (A) step.

(7) The substrate treatment method according to any one of the (1) to (6), wherein a viscosity of the coating solution is 1000 cp or more.

(8) The substrate treatment method according to any one of the (1) to (7), wherein a film thickness of the coating film is 10 μm or more.

(9) The substrate treatment method according to any one of the (1) to (8), wherein the coating film is peeled from the substrate and used as a flexible circuit board.

(10) A substrate treatment system for treating a substrate, including:
a plurality of heating apparatuses each having a hot plate which heats the substrate;
a removing apparatus having a substrate holder which holds the substrate, a rotation mechanism which rotates the substrate held on the substrate holder, a discharger which discharges a removing solution, and a moving mechanism which moves the discharger; and
a control device, wherein:
the control device is configured to control the plurality of heating apparatuses and the removing apparatus to perform the steps of:
(A) heating the substrate having a coating film formed on a surface thereof by supply of a coating solution, in one of the heating apparatuses;
(B), after the (A) step, moving a discharge destination of the removing solution from the discharger in a range from a first position different from a peripheral position on the surface of the substrate to the peripheral position while rotating the substrate, in the removing apparatus;
(C), after the (B) step, moving the discharge destination of the removing solution in a range from a second position on a side closer to an outside than the first position to the peripheral position on the surface of the substrate while rotating the substrate, in the removing apparatus;
(D), after the (C) step, heating again the substrate, in another of the heating apparatuses; and
(E), after the (B) step and before the (C) step, rotating the substrate at a number of rotations higher than numbers of rotations in the (B) step and the (C) step in a state where the supply of the removing solution to the surface of the substrate is stopped; and
set temperatures of the hot plates in the one of the heating apparatuses and the another of the heating apparatuses are almost same.

EXPLANATION OF CODES 1 wafer treatment system
4 control device
30 coating apparatus
40, 40a thermal treatment apparatus
41 thermal treatment apparatus
110 spin chuck
111 chuck drive
127 solvent discharge nozzle
128 nozzle drive
142 hot plate
F polyimide film
P0 peripheral position
P1 first position
P2 second position
S solvent
W wafer

What is claimed is:
1. A substrate treatment method for treating a substrate, comprising the steps of:
(A) heating the substrate having a coating film formed on a surface thereof by supply of a coating solution;
(B), after the (A) step, moving a discharge nozzle, wherein the discharge nozzle is configured to discharge a removing solution for removing the coating film to a destination of the removing solution on the surface of the substrate, so that the destination is moved from a peripheral position on the surface of the substrate in a direction toward a center of the substrate, then upon the destination reaching a predetermined first position on the surface different from the peripheral position moving the discharge nozzle so that the destination returns from the first position to the peripheral position, all while rotating the substrate and while continuously discharging the removing solution from the discharge nozzle;

(C), after the (B) step, moving the discharge nozzle so that the destination of the removing solution on the surface is moved from the peripheral position in the direction toward the center, then upon the destination reaching a predetermined second position on the surface, the predetermined second position being on a side closer to an outside of the substrate than the first position, moving the discharge nozzle so that the destination returns from the predetermined second position to the peripheral position on the surface of the substrate, all while rotating the substrate and while continuously discharging the removing solution from the discharge nozzle;

(D), after the (C) step, heating again the substrate; and (E), after the (B) step and before the (C) step, rotating the substrate at a number of rotations higher than numbers of rotations in the (B) step and the (C) step in a state where none of the removing solution is being supplied to the surface of the substrate, wherein in the (B) step, the moving the discharge nozzle so that the destination returns from the first position to the peripheral position comprises moving the discharge nozzle in stages while the destination is in a first discharge range while not overlapped with a second discharge range, and moving the discharge nozzle continuously and at a constant speed while the destination is in the first discharge range while overlapped with the second discharge range, the first discharge range being from the first position to the peripheral position on the surface of the substrate, the second discharge range being from the second position to the peripheral position on the surface of the substrate, wherein the second position is at a position 1.0 mm to 1.5 mm from the peripheral position.

2. The substrate treatment method according to claim 1, wherein
temperatures of the substrate in the (A) step and the (D) step are almost same.

3. The substrate treatment method according to claim 1, wherein
the numbers of rotations of the substrate in the (B) step and the (C) step are almost same.

4. The substrate treatment method according to claim 1, further comprising the step of (F) monitoring a treatment state of the substrate in the (A) step.

5. The substrate treatment method according to claim 4, wherein
a treatment condition in the (A) step for a subsequent substrate is corrected based on a monitoring result of the treatment state.

6. The substrate treatment method according to claim 4, wherein
a treatment condition in at least one of the (B) step and the (C) step subsequent to the (A) step is corrected based on a monitoring result of the treatment state in the (A) step.

7. The substrate treatment method according to claim 1, wherein
a viscosity of the coating solution is 1000 cp or more.

8. The substrate treatment method according to claim 1, wherein
a film thickness of the coating film is 10 μm or more.

9. The substrate treatment method according to claim 1, wherein
the coating film is peeled from the substrate and used as a flexible circuit board.

10. The substrate treatment method according to claim 1, the (B) step further comprising
responsive to the destination reaching the first position, controlling the discharge nozzle to be stopped for a predetermined time in a state in which the discharging of the removing solution is continued, before moving the discharge nozzle so that the destination returns from the first position to the peripheral position.

* * * * *